(12) United States Patent
Yang et al.

(10) Patent No.: US 6,734,559 B1
(45) Date of Patent: May 11, 2004

(54) SELF-ALIGNED SEMICONDUCTOR INTERCONNECT BARRIER AND MANUFACTURING METHOD THEREFOR

(75) Inventors: Kai Yang, San Jose, CA (US); Takeshi Nogami, Kanagawa (JP); Dirk Brown, Sunnyvale, CA (US); Shekhar Pramanick, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 195 days.

(21) Appl. No.: 09/663,021

(22) Filed: Sep. 15, 2000

Related U.S. Application Data

(60) Provisional application No. 60/154,606, filed on Sep. 17, 1999.

(51) Int. Cl.[7] .................. H01L 23/48; H01L 23/52; H01L 29/40
(52) U.S. Cl. ................. 257/751; 250/750; 438/652
(58) Field of Search .................. 257/751, 750, 257/758, 767; 438/627, 643, 622, 652, 653

(56) References Cited

U.S. PATENT DOCUMENTS

| | | | |
|---|---|---|---|
| 5,300,813 A | 4/1994 | Joshi et al. ............... 257/752 |
| 5,592,024 A | 1/1997 | Aoyama et al. ............ 257/751 |
| 5,695,810 A * | 12/1997 | Dubin et al. |
| 5,705,849 A * | 1/1998 | Zheng et al. |
| 5,889,328 A * | 3/1999 | Joshi et al. |
| 6,077,774 A | 6/2000 | Hong et al. ................. 438/643 |
| 6,100,184 A * | 8/2000 | Zhao et al. |
| 6,107,687 A | 8/2000 | Fukada et al. .............. 257/762 |
| 6,114,238 A * | 9/2000 | Liao |
| 6,146,986 A * | 11/2000 | Wagganer et al. |
| 6,157,081 A * | 12/2000 | Nariman et al. |
| 6,172,421 B1 * | 1/2001 | Besser et al. |
| 6,207,552 B1 | 3/2001 | Wang et al. ................ 438/618 |
| 6,271,595 B1 | 8/2001 | McGahay et al. .......... 257/762 |
| 6,417,561 B1 * | 7/2002 | Tuttle |

* cited by examiner

*Primary Examiner*—Sheila V. Clark
(74) *Attorney, Agent, or Firm*—Mikio Ishimaru

(57) ABSTRACT

A self-aligned semiconductor interconnect barrier between channels and vias is provided which is self-aligned and made of a metallic barrier material. A channel is conventionally formed in the semiconductor dielectric, lined with a first metallic barrier material, and filled with a conductive material. A recess is etched to a predetermined depth into the conductive material, and the second metallic barrier material is deposited and removed outside the channel. This leaves the conductive material totally enclosed in metallic barrier material. The metallic barrier material is selected from metals such as tantalum, titanium, tungsten, compounds thereof, alloys thereof, and combinations thereof.

20 Claims, 2 Drawing Sheets

SELF-ALIGNED SEMICONDUCTOR INTERCONNECT BARRIER AND MANUFACTURING METHOD THEREFOR

CROSS-REFERENCE TO RELATED APPLICATION(S)

This application claims the benefit of U.S. Provisional Patent Application Serial No. 60/154,606 filed Sep. 17, 1999, which is incorporated herein by reference thereto.

TECHNICAL FIELD

The present invention relates generally to semiconductors and more specifically to interconnect barrier materials.

BACKGROUND ART

While manufacturing integrated circuits, after the individual devices, such as the transistors, have been fabricated in the silicon substrate, they must be connected together to perform the desired circuit functions. This connection process is generally called "metallization", and is performed using a number of different photolithographic and deposition techniques.

One metallization process, which is called the "damascene" technique, starts with the placement of a first channel dielectric (oxide) layer, which is typically an oxide layer, over the semiconductor devices. A first damascene step photoresist is then placed over the oxide layer and is photolithographically processed to form the pattern of the first channels. An anisotropic oxide etch is then used to etch out the channel dielectric (oxide) layer to form the first channel openings. The damascene step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductive material and to act as a barrier material to prevent diffusion of such conductive material into the oxide layer and the semiconductor devices (the combination of the adhesion and barrier material is collectively referred to as "barrier layer herein). It should be noted that some barrier materials also have good adhesion, which is why the adhesion layer is optional. A "seed" layer is then deposited to act as a seed for additional conductive material to be deposited. A first conductive material is then deposited and subjected to a chemical-mechanical polishing process which removes the first conductive material above the first channel dielectric (oxide) layer and damascenes the first conductive material in the first channel openings to form the first channels.

For multiple layers of channels, another metallization process, which is called the "dual damascene" technique, is used in which the channels and vias are formed at the same time. In one example, the via formation step of the dual damascene process starts with the deposition of a thin stop nitride over the first channels and the first channel dielectric (oxide) layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric (oxide) layer, which is typically an oxide layer, is then deposited over the via nitride and the exposed oxide in the via area of the via nitride. A second damascene step photoresist is placed over the second channel dielectric (oxide) layer and is photolithographically processed to form the pattern of the second channels. An anisotropic oxide etch is then used to etch the second channel dielectric (oxide) layer to form the second channel openings and, during the same etching process to etch the via areas down to the thin stop (nitride) layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and a cylindrical via opening to form the second channel and the via. A second chemical mechanical polishing process leaves the two vertically separated, horizontally perpendicular channels connected by a cylindrical via.

The use of the damascene techniques eliminates metal etch and dielectric gap fill steps typically used in the metallization process. The elimination of metal etch steps is important as the semiconductor industry moves from aluminum to other metallization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), titanium nitride (TiN), or tungsten nitride (WN) are used as barrier materials for copper. A thin adhesion layer formed of an adhesion material, such as pure tantalum (Ta), titanium (Ti), or tungsten (W), is first deposited on the dielectrics or vias to ensure good adhesion and good electrical contact of the subsequently deposited barrier layers to underlying doped regions and/or conductive channels. Barrier layer stacks formed of adhesion/barrier materials such as tantalum/tantalum nitride (Ta/TaN), titanium/titanium nitride (Ti/TiN), and tungsten/tungsten nitride (W/WN) have been found to be useful as adhesion/barrier material combination for copper interconnects. It will be understood that either the pure metals or the metal compounds may be used either singularly or in combination.

For capping barriers between conductive channels, the preferred barrier material has been silicon nitride since it is a good barrier material. However, it has a high dielectric constant which means it tends to increase capacitance between channels and thus reduce semiconductor circuit speed.

However, even with the various types of barrier layers, copper is still subject to strong electro-migration, or movement of copper atoms under current which can lead to voids in the copper channels and vias. Copper also has poor surface adhesion. A solution, which would form a better capping material with better surface adhesion to reduce electro-migration and a lower dielectric constant, has been long sought. As the semiconductor industry is moving from aluminum to copper and other type of materials in order to obtain higher semiconductor circuit speeds, it is becoming more pressing that a solution be found.

DISCLOSURE OF THE INVENTION

The present invention provides a semiconductor interconnect barrier between channels and vias as between channels and dielectrics, and a manufacturing method therefor. The material provides a lower dielectric constant, lower diffusion barrier characteristics, lower surface diffusion characteristics, and improved adhesion over conventional silicon nitride.

The present invention further provides a self-aligned semiconductor interconnect barrier between channels and vias selected from tantalum, titanium, tungsten, compounds thereof, alloys thereof, and combinations thereof. The barrier is self-aligned and formed by etching a recess in a deposited channel conductor, depositing the barrier material, and removing the barrier material outside the channel by chemical-mechanical polishing.

The present invention further provides a method of manufacturing self-aligned semiconductor interconnect barriers between channels and vias of any desired material.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
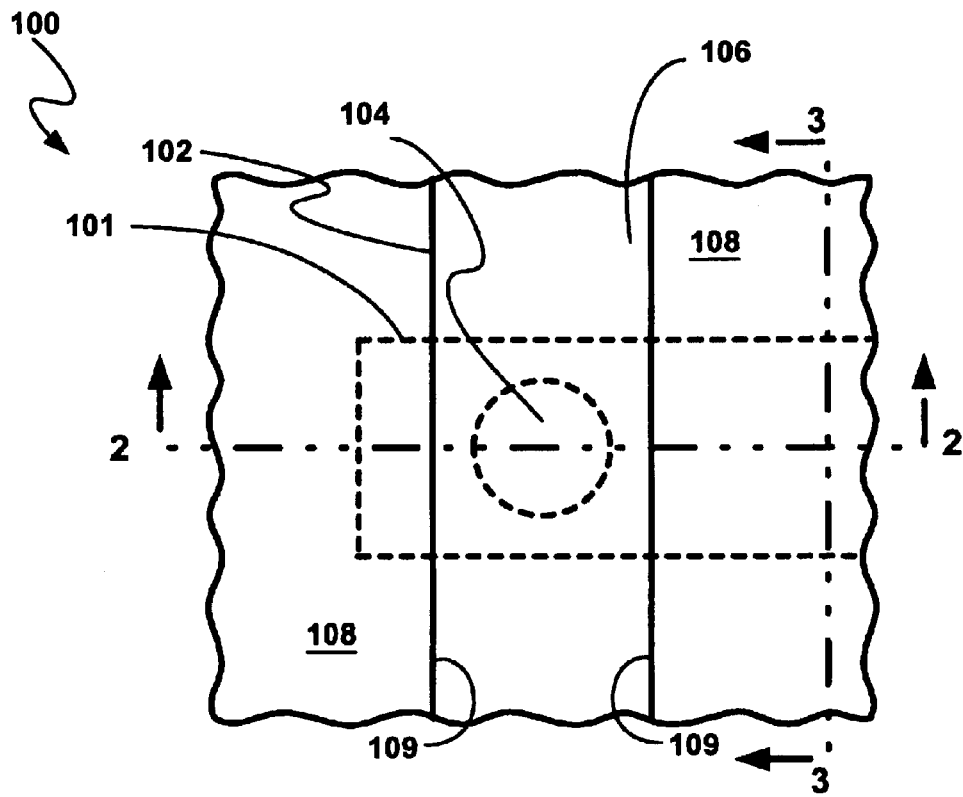
FIG. 1 (PRIOR ART) is a plan view of an integrated circuit with aligned channels with a prior art via.

Referring now to FIG. 1 (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel 101 contains a conductive material. The second channel 102 is formed by filling a second channel opening 106 disposed in a second channel dielectric (oxide) layer 108 with the conductive material. The oxide layers are generally of silicon dioxide ($SiO_2$). The second channel opening 106 is defined by walls (sidewalls) 109 of the second channel dielectric (oxide) layer 108.

Figure 2:
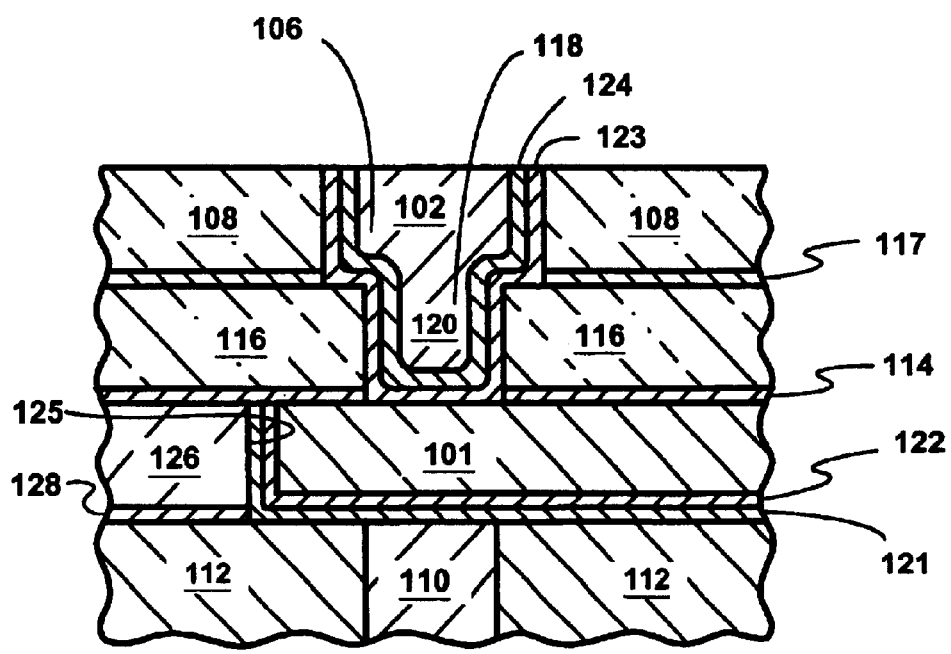
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along 2—2. The first channel 101 is disposed over a conductive via, such as a (tungsten) via 110, and a dielectric (oxide) layer 112 of a semiconductor device on an integrated circuit chip (not shown). The first and second channels 101 and 102 are in horizontal planes separated vertically by a stop (nitride) layer 114, a via (oxide) layer 116, and a thin via (nitride) layer 117. The nitride layers are composed of silicon nitride (SiN). The cross-sectional area of the round via 104 of FIG. 1 (PRIOR ART) defines a cylindrical to via 120 when it is filled with the second conductive material. Also shown disposed around the first channel 101 is a barrier layer 121, a seed layer 122 and around the second channel 102 and the cylindrical via 120 is a barrier layer 123 and a seed layer 124. The first channel 101, the barrier layer 121, and the seed layer 122 are disposed in a first channel opening 125 of a first channel dielectric (oxide) layer 126 and a stop (nitride) layer 128.

Figure 3:
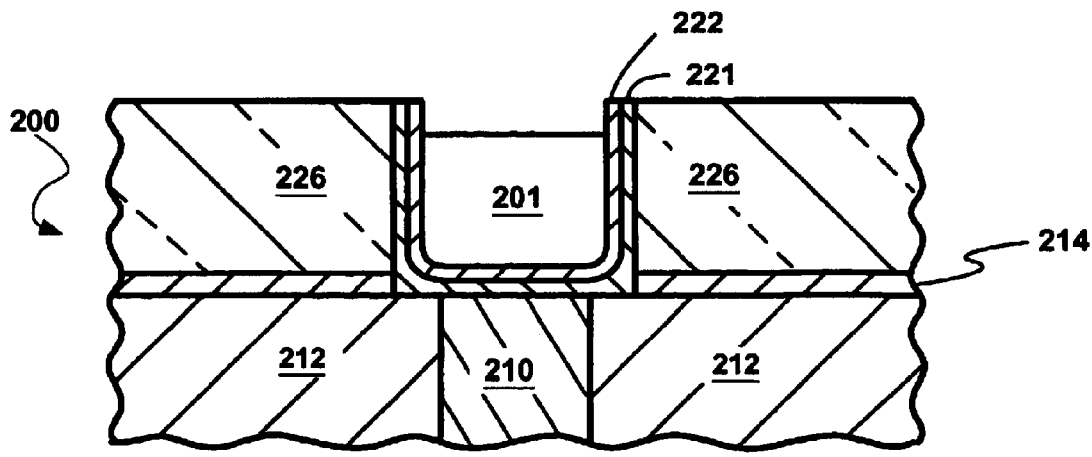
FIG. 3 is a simplified cross-section of a partially processed integrated circuit after chemical-mechanical polishing of conductive material down to the dielectric layer and etching of the conductive material.

Referring now to FIG. 3, therein is shown the cross-section of a semiconductor wafer 200 in a preliminary stage of manufacture according to the present invention. Strictly for ease of understanding, the completed semiconductor wafer 200 can be understood to be the equivalent of the semiconductor wafer 100 taken along the line 3—3. Thus, the cross-section of FIG. 3 shows the cross-section of semiconductor wafer 200 with a (tungsten) via 210 in a dielectric (oxide) layer 212. A recessed first channel 201 is shown disposed in a stop (nitride) layer 214 and a first channel dielectric (oxide) layer 226.

FIG. 3 also shows the semiconductor wafer 200 after the deposition of a barrier layer 221, a seed layer 222 around the recessed first channel 201. The barrier layer 221 would be formed of barrier materials, such as Ta/TaN, Ti/TiN, W/WN, and the recessed first channel 201 would be formed of copper or a copper alloy. The surface of the recessed first channel 201, the barrier layer 221, and the seed layer 222 have been subject to chemical-mechanical polishing (CMP) to be level with the first channel dielectric (oxide) layer 226. The surface of the recessed first channel 201 has then been etched back or recessed to reduce its height by a "predetermined" thickness which is approximately the thickness of a self-aligned semiconductor interconnect barrier (to be formed in FIG. 4 as will hereinafter be described).

Figure 4:
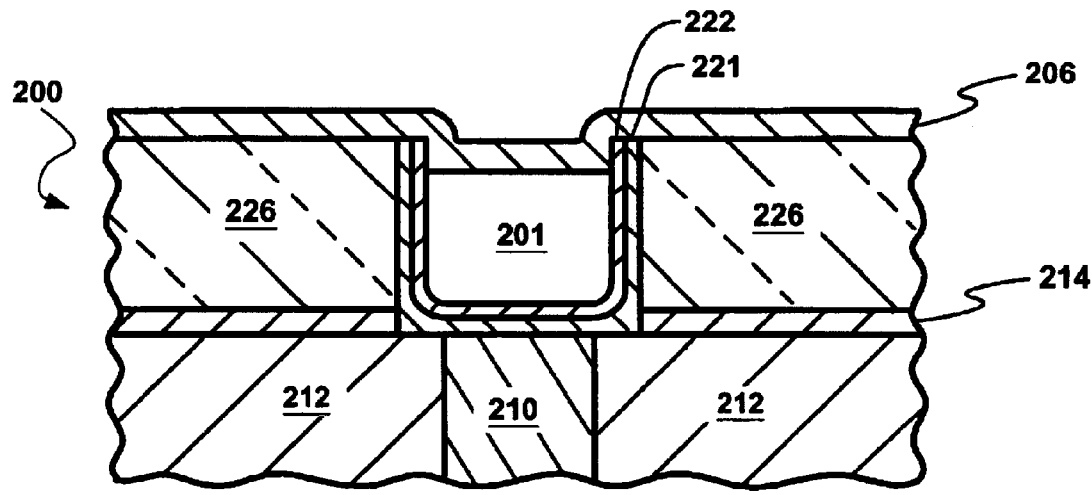
FIG. 4 is the structure of FIG. 3 after deposition of the interconnect barrier layer.

Referring now to FIG. 4, therein is shown the cross-section structure shown in FIG. 3 after the deposition of a semiconductor interconnect barrier layer 206 on top of the semiconductor wafer 200. The semiconductor interconnect barrier layer 206 would be formed of barrier materials such as Ta/TaN, Ti/TiN, and W/WN which are both excellent barrier materials and which have excellent adhesion characteristics with the conductive material in the recessed first channel 201.

Figure 5:
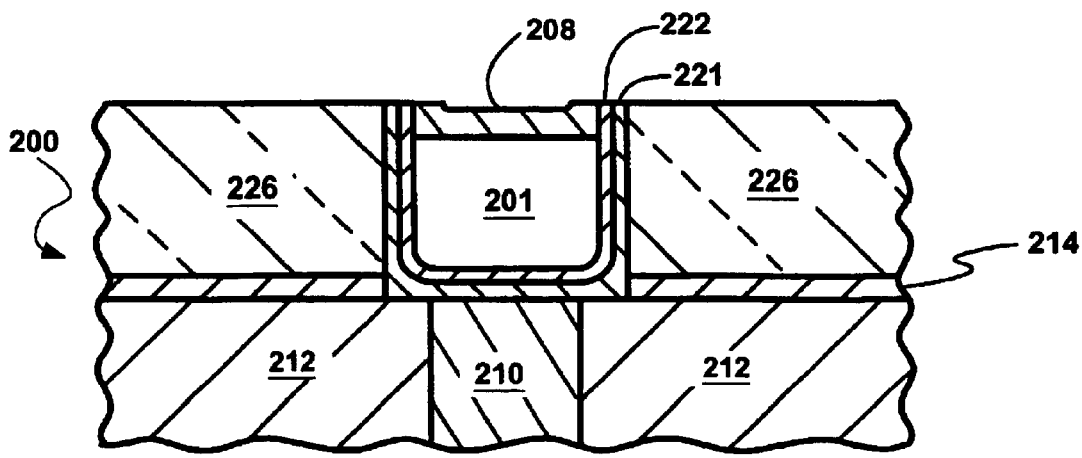
FIG. 5 is the structure of FIG. 4 after chemical-mechanical polishing to form the self-aligned interconnect barrier.

Referring now to FIG. 5, therein is shown a self-aligned semiconductor interconnect barrier 208 which is formed after CMP of the semiconductor interconnect barrier layer 206 down to the surface of the first channel dielectric (oxide) layer 226.

In production in the past as shown in FIGS. 1 (PRIOR ART) and 2 (PRIOR ART), a conventional first damascene process was used to put down, over the production semiconductor wafer 100, the first channel 101 in the first channel dielectric (oxide) layer 126 above the (tungsten) via 110 and the dielectric (oxide) layer 112 of the semiconductor device. The damascene process is a photolithographic process which uses a mask and developing to define a first channel opening 125 in the first channel dielectric (oxide) layer 126. The first channel opening 125 was then filled with the thin barrier layer 121, the thin seed layer 122, and the first conductive material, such as copper, to form the first channel 101 using conventional metal deposition techniques, such as physical vapor deposition, chemical vapor deposition, electroplating, or a combination thereof. The top surface would then be subject to CMP.

Subsequently, the process will return to FIGS. 1 (PRIOR ART) and 2 (PRIOR ART) where the second channel 102, the stop (nitride) layer 114, the via (oxide) layer 116, and the via (nitride) layer 117 would be successively deposited and processed using conventional deposition techniques on top of the FIG. 5 structures of the self-aligned semiconductor interconnect barrier 208 on the first channel 201 and the first channel dielectric (oxide) layer 212.

By using the via photoresist and the via photolithographic process followed by nitride etching of a round via opening 104 in the via (nitride) layer 117, the basis for the cylindrical via 120 is formed. The subsequent deposition of the second channel dielectric (oxide) layer 108 prepares the way for the second channel 102 to be perpendicular to the first channel 201 capped by the self-aligned semiconductor interconnect barrier 208 of FIG. 5.

Returning to FIGS. 1 (PRIOR ART) and 2 (PRIOR ART), the second damascene process is the photolithographic process which uses a mask to define the second channel opening 106 in the second channel dielectric (oxide) layer 108. Since the second damascene process uses an anisotropic oxide etch, the etch also forms the cylindrical via opening 118 down to the stop (nitride) layer 114. The anisotropic oxide etch etches faster in the vertical direction of FIG. 2 than in the horizontal direction. The nitride etch of the stop (nitride) layer 114 exposes a portion of the first channel 101 and completes the etching steps. The second channel opening 106 is then filled with the thin barrier layer 123, the thin seed layer 124, and the second conductive material. The second conductive material is also a conductor, such as copper, which forms the second channel 102 using conventional metal deposition techniques, such as physical vapor deposition, chemical vapor deposition, electroplating, or a combination thereof. A CMP process is used to level the second channel 102 to form the structure shown in FIG. 2 (PRIOR ART).

Next, the second conductive material is deposited into second channel opening 106 and the cylindrical via opening 118 using conventional metal deposition techniques, such as physical vapor deposition, chemical vapor deposition, electroplating, or a combination thereof. Thereafter, a CMP process is used to complete the conventional process.

In production with the present invention as shown in FIGS. 3–5, said steps are the same through the first damascene process of filling the first channel opening with the thin adhesive layer 221, the thin seed layer 222, and the first conductive material. The conventional CMP would be used to remove the first conductive material down to the first channel dielectric (oxide) layer 226.

The conductive material in the first channel 201 is then subject to an etch back by a wet or dry etching. Generally, the predetermined etch back will remove at least as much of the first channel 201 as required for the thickness of a conventional barrier layer to form the recessed first channel 201.

The semiconductor interconnect barrier layer 206 is then deposited on the semiconductor wafer 200 using the same methods as used for depositing the barrier layer 121. This process fills the etch back recess and subsequent CMP forms the self-aligned semiconductor interconnect barrier 208 which is automatically self-aligned with the recessed first channel 201.

Since the barrier materials form a superior intermetallic interface with conductive materials such as copper, there will be much lower diffusivity of copper and the electromigration resistance of the copper channels is improved. Further, there is no need to put silicon nitride on the copper channels, which results in a reduction of gross capacitance of the semiconductor device.

In addition, after completion of the above process, the dielectric layers can be stripped out to form copper interconnects which are completely covered with diffusion barriers. This interconnect system would have very low capacitance.

The remainder of the process would continue with the deposition of stop (nitride) layer 114 and the remainder of the second damascene process over the self-aligned semiconductor interconnect barrier 208. Subsequently, the damascene semiconductor wafer processing can be repeated for additional levels of channels and vias with self-aligned semiconductor interconnect barriers between each level.

While the best mode utilizes a barrier material selected from tantalum, titanium, tungsten, compounds thereof, alloys thereof, and combinations thereof, it should be understood that other barrier materials with good electromigration preventing characteristics may be used.

Also while the best mode utilizes copper as the conductive material, it should be understood that the present invention is applicable to conductive materials such as copper, aluminum, doped polysilicon, gold, silver, compounds thereof, alloys thereof, and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling a via with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor device, comprising:
    a semiconductor with a dielectric layer formed thereon, wherein said dielectric layer overlays a region on said semiconductor and has a channel opening provided therein;
    a first barrier layer disposed in said dielectric layer lining said channel opening, said first barrier layer of a barrier material;
    a conductive material recessed in said first barrier layer in said channel opening to form a recessed channel; and
    a second barrier layer disposed in said first barrier layer and over said conductive layer, said second barrier layer of a barrier material.

2. The semiconductor device as claimed in claim 1 wherein said first barrier layer is a metallic barrier material selected from a group comprising tantalum, titanium, tungsten, a compound thereof, and a combination thereof.

3. The semiconductor device as claimed in claim 1 wherein said second barrier layer is a metallic barrier material selected from a group comprising tantalum, titanium, tungsten, a compound thereof, and a combination thereof.

4. The semiconductor device as claimed in claim 1 wherein said conductive material is selected from a group comprising copper, aluminum, doped polysilicon gold, silver, a compound thereof, and a combination thereof.

5. The semiconductor device as claimed in claim 1 wherein said first and second barrier layers are of the same metallic barrier material.

6. The semiconductor device as claimed in claim 1 wherein said first and second barrier layers have substantially the same thickness.

7. A method of manufacturing a semiconductor device, comprising said steps of:

provide a semiconductor with a dielectric layer formed thereon;

forming an opening in said dielectric layer, said opening defined by walls of said dielectric layer;

forming a first barrier layer in said opening and lining said dielectric layer, said first barrier layer is a barrier material;

forming a conductive layer on said first barrier in said opening;

removing said conductive layer and said first barrier layer outside said opening down to said dielectric layer;

recessing said conductive layer inside said first barrier layer form a recessed channel; and forming a second barrier layer in said first barrier layer and over said conductive layer, said second barrier layer is a barrier material.

8. The method for manufacturing a semiconductor device as claimed in claim 7 wherein said step of forming said first barrier layer uses a metallic barrier material selected from a group comprising tantalum, titanium, tungsten, a compound thereof, and a combination thereof.

9. The method for manufacturing a semiconductor device as claimed in claim 7 wherein said step of forming said second barrier layer uses a metallic barrier material selected from a group comprising tantalum, titanium, tungsten, a compound thereof, and a combination thereof.

10. The method for manufacturing a semiconductor device as claimed in claim 7 wherein said step of forming said conductive material uses a material selected from a group comprising copper, aluminum, doped polysilicon, gold, silver, a compound thereof, and a combination thereof.

11. The method for manufacturing a semiconductor device as claimed in claim 7 wherein said step of forming said first and second barrier layer uses the same metallic barrier material.

12. The method for manufacturing a semiconductor device as claimed in claim 7 wherein said step of forming said first and second barrier layer for said first and second barrier layers have substantially the same thickness.

13. A method of manufacturing a semiconductor device, comprising said steps of:

providing a semiconductor wafer with a dielectric layer formed thereon;

forming an opening in said dielectric layer, said opening defined by walls of said dielectric layer;

depositing a first barrier layer on said semiconductor wafer and in said opening to line said dielectric layer, said first barrier layer is a metallic material;

depositing a conductive layer on said first barrier layer on said semiconductor wafer and in said opening, said conductive layer filling said opening;

removing said conductive layer and said first barrier layer on said semiconductor wafer outside said opening down to said dielectric layer;

recessing said conductive layer inside said first barrier layer to predetermined depth to form a recessed channel;

depositing a second barrier layer over said semiconductor wafer and said recessed channel in said first barrier layer to fill said first barrier layer to about said predetermined depth, said second barrier layer is a metallic barrier material; and removing said second barrier layer on said semiconductor wafer outside said first barrier layer to said dielectric layer.

14. The method for manufacturing a semiconductor device as claimed in claim 13 wherein said step of depositing said first barrier layer uses a metallic barrier material selected from a group comprising tantalum, titanium, tungsten, a compound thereof, and a combination thereof.

15. The method for manufacturing a semiconductor device as claimed in claim 13 wherein said step of depositing said second barrier layer uses a metallic barrier material elected from a group comprising tantalum, titanium, tungsten, a compound thereof, and a combination thereof.

16. The method for manufacturing a semiconductor device as claimed in claim 13 wherein said step of depositing said conductive material uses a material selected from a group comprising copper, aluminum, doped polysilicon, gold, silver, a compound thereof, and a combination thereof.

17. The method for manufacturing a semiconductor device as claimed in claim 13 wherein said step of depositing said first and second barrier layer uses the same metallic barrier material.

18. The method for manufacturing a semiconductor device as claimed in claim 13 wherein said step of removing said conductive layer to a predetermined depth removes said first barrier to the same depth as the thickness that said first barrier layer is deposited.

19. A semiconductor device, comprising:

a semiconductor;

a dielectric layer formed on the semiconductor, said dielectric layer having a channel opening provided therein;

a recessed channel in said channel opening including:

a first barrier layer disposed in said channel opening, said first barrier layer of a metallic barrier material; and a conductive material recessed in said first barrier layer; and a self-aligned barrier disposed in said first barrier layer and over said recessed conductive material in said channel opening.

20. The semiconductor device as claimed in claim 19 wherein said first barrier layer and said self-aligned barrier totally enclose the conductive material.

* * * * *